(12) United States Patent
Sanji

(10) Patent No.: US 10,209,704 B2
(45) Date of Patent: Feb. 19, 2019

(54) DATA UPDATING METHOD OF CIRCUIT BOARD WORK SYSTEM AND CIRCUIT BOARD WORK SYSTEM

(71) Applicant: FUJI CORPORATION, Chiryu (JP)

(72) Inventor: Mitsuru Sanji, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 146 days.

(21) Appl. No.: 15/039,663

(22) PCT Filed: Nov. 29, 2013

(86) PCT No.: PCT/JP2013/082180
§ 371 (c)(1),
(2) Date: May 26, 2016

(87) PCT Pub. No.: WO2015/079560
PCT Pub. Date: Jun. 4, 2015

(65) Prior Publication Data
US 2017/0023931 A1    Jan. 26, 2017

(51) Int. Cl.
*G05B 19/00*  (2006.01)
*G05B 19/4155*  (2006.01)
(Continued)

(52) U.S. Cl.
CPC ..... *G05B 19/4155* (2013.01); *G05B 19/4185* (2013.01); *H05K 13/08* (2013.01); *G05B 2219/31399* (2013.01); *G05B 2219/31422* (2013.01); *G05B 2219/31484* (2013.01); *G05B 2219/32148* (2013.01);
(Continued)

(58) Field of Classification Search
CPC ............... G05B 19/4155; H05K 13/08; G06F 17/30575
See application file for complete search history.

(56) References Cited

U.S. PATENT DOCUMENTS

2004/0153868 A1*  8/2004  Nonaka ............ G05B 19/41805
714/47.2
2005/0144271 A1*  6/2005  Shirane ............... H04L 41/0883
709/223

FOREIGN PATENT DOCUMENTS

JP       6-121061 A       4/1994
JP    2000-330779 A      11/2000
(Continued)

OTHER PUBLICATIONS

International Search Report dated Jan. 28, 2014 in PCT/JP2013/082180 filed on Nov. 29, 2013.
(Continued)

*Primary Examiner* — Nicholas J Tobergte
(74) *Attorney, Agent, or Firm* — Oblon, McClelland, Maier & Neustadt, L.L.P.

(57) ABSTRACT

In an electronic component mounting system, when a change in a recipe (setting data) for a control computer are input in any one of a plurality of circuit board working machines, such as component mounting machines, the control computer reports changed content to a host computer. The host computer, which receives the report, updates the data, which is stored in the DB server, based on the changed content of the recipe. The control computer, which receives input of the change in the recipe, executes a process in which only the partial data, which is updated by the host computer, is acquired among the data items, which are stored in the DB server.

6 Claims, 8 Drawing Sheets

(51) Int. Cl.
  *H05K 13/08*  (2006.01)
  *G05B 19/418*  (2006.01)
(52) U.S. Cl.
  CPC ............ *G05B 2219/34038* (2013.01); *G05B 2219/45029* (2013.01); *G05B 2219/45035* (2013.01); *Y02P 90/04* (2015.11); *Y02P 90/18* (2015.11); *Y02P 90/20* (2015.11)

(56) References Cited

FOREIGN PATENT DOCUMENTS

| | | |
|---|---|---|
| JP | 2004-235307 | 8/2004 |
| JP | 2006-279685 A | 10/2006 |
| JP | 4291586 B2 | 7/2009 |
| JP | 2009-239126 A | 10/2009 |
| JP | 2013-38189 A | 2/2013 |

OTHER PUBLICATIONS

Chinese Office Action for Chinese Patent Application 201380080844.5, dated May 16, 2018. English translation provided. 24pgs.

\* cited by examiner

FIG. 6

JOB DATA — 91

SEQUENCE DATA — 111

| X-AXIS COORDINATE | Y-AXIS COORDINATE | ROTATIONAL ANGLE | CIRCUIT SYMBOL |
|---|---|---|---|
| X1 | Y1 | θ1 | Ref1 |
| X2 | Y2 | θ2 | Ref2 |
| X3 | Y3 | θ3 | Ref3 |
| ⋮ | ⋮ | ⋮ | ⋮ |

BOM DATA — 112

BOM1

| CIRCUIT SYMBOL | COMPONENT TYPE |
|---|---|
| Ref1 | a |
| Ref2 | b |
| Ref3 | c |
| ⋮ | ⋮ |

BOM2

| CIRCUIT SYMBOL | COMPONENT TYPE |
|---|---|
| Ref1 | a |
| Ref2 | b |
| Ref3 | d |
| ⋮ | ⋮ |

· · · · ·

PART DATA — 113

| COMPONENT TYPE | SHAPE OF COMPONENT | | | SUPPLY MODE |
|---|---|---|---|---|
| | X-AXIS LENGTH | Y-AXIS LENGTH | LEAD TYPE | |
| a | x1 | y1 | r1 | 8 MM TAPE, 4 MM FEED |
| b | x2 | y2 | r2 | 8 MM TAPE, 4 MM FEED |
| c | x3 | y3 | r3 | 12 MM TAPE, 6 MM FEED |
| d | x4 | y4 | r4 | 12 MM TAPE, 6 MM FEED |
| ⋮ | ⋮ | ⋮ | ⋮ | ⋮ |

BOARD TYPE CORRELATION DATA

| BOARD TYPE | BOM |
|---|---|
| Key1 | BOM1 |
| Key2 | BOM2 |
| Key3 | BOM3 |
| ⋮ | ⋮ |

— 114

DATA UPDATING METHOD OF CIRCUIT BOARD WORK SYSTEM AND CIRCUIT BOARD WORK SYSTEM

TECHNICAL FIELD

The present disclosure relates to an updating method of data relating to a circuit board work system in which electronic components are mounted onto a circuit board such as a printed wiring board, and relates to the circuit board work system.

BACKGROUND ART

There is a circuit board work system which uses a database server in the control of the circuit board work system in which a printed circuit board or the like is produced by mounting electronic components onto the printed circuit board (PTL 1 or the like). For example, the circuit board work system disclosed in PTL 1 is a system in which a circuit board working machine such as a screen printer, an adhesive application machine, an electronic component mounting machine, or a reflow furnace is controlled by a host computer. In the circuit board work system, a control computer of each circuit board working machine directly accesses a database server, and collects data relating to a work target circuit board, for example, data such as the type of electronic components which are supplied from component feeders with which the electronic component mounting machine is provided, the shapes of the components, and the mounting positions.

In this type of circuit board work system, for example, setting data (in PTL 1, a control program or a recipe) to be used in the control by the control computer of the circuit board working machine is created by a host computer based on the data that is stored in the database server. The control computer of each circuit board working machine executes the mounting operation or the like based on the setting data which is created by the host computer. Meanwhile, for example, in a case in which the inspection result of the produced printed circuit board is faulty and a worker performs an operation of changing the created setting data, the control computer performs a process in which the changed content of the data is reported to the host computer. At this time, in the circuit board work system, for example, from the perspective of securing the operational stability of the system or the like, it is necessary to link the setting data with which both the control computer and the host computer are provided after the changed content is approved at the host computer, and generally, a setting is adopted in which the setting data is not changed by the control computer until the control computer receives information indicating that the data updating of the database server is completed from the host computer. When the control computer receives the updated information from the host computer, the control computer executes changing on the setting data.

CITATION LIST

Patent Literature

PTL 1: Japanese Patent No. 4291586

SUMMARY

Technical Problem

In the related art, for example, after updating the database server, the host computer executes a process in which a recipe which is newly created based on the updated data is transferred to the control computer. In other words, when the control computer receives the updated information from the host computer, all of the newly created setting data is received and used to replace the setting data being executed, and thus, the changed content is reflected in the created setting data. However, since the setting data includes data of the component type and the mounting position of the component for each of a plurality of electronic components to be mounted onto one circuit board, the data amount increases in accordance with an increase in the number of electronic components to be mounted, that is, an increase in the integration density. Therefore, in the control computer of each circuit board working machine, every time there is an operation changing the created setting data, a problem may arise in that the processing time of the data transfer which is performed between the control computer and the database server becomes longer due to receiving the entirety of the setting data again, and a delay will arise in the starting time of the next work after the change.

The present disclosure was made in light of the problems described above, and an object thereof is to provide a data updating method of a circuit board work system and the circuit board work system which are capable of obtaining a reduction in transfer time while reliably transferring changed content of data relating to a work target circuit board between a database server and a circuit board working machine.

Solution to Problem

A data updating method of a circuit board work system according to the technology disclosed in the present application which is made in light of the problems described above includes a plurality of circuit board working machines each of which is provided with a control computer and which performs work on a circuit board, a host computer which is provided to be shared by the plurality of circuit board working machines and which manages each of the control computers, and a database server in which data relating to a work target circuit board is stored, the method including a step of reporting a change in data relating to the work target circuit board to the host computer, a step of updating the data which is stored in the database server based on the change in the data relating to the work target circuit board for which the report is received, and a step of acquiring partial data relating to the update among the data items which are stored in the database server by the control computer.

A circuit board work system according to the technology disclosed in the present application which is made in light of the problems described above includes a plurality of circuit board working machines each of which is provided with a control computer and which performs work on a circuit board, a host computer which is provided to be shared by the plurality of circuit board working machines and which manages each of the control computers, a database server in which data relating to a work target circuit board is stored, a change reporting section which reports a change in data relating to the work target circuit board to the host computer, a database updating section which updates the data which is stored in the database server based on the change in the data relating to the work target circuit board for which the report is received, and a data acquisition section which is provided in the control computer and acquires partial data relating to the update by the database updating section.

Effects

According to the technology disclosed in the present application, it is possible to provide a data updating method of a circuit board work system and the circuit board work system which are capable of obtaining a reduction in transfer time while reliably transferring changed content of data relating to a work target circuit board between a database server and a circuit board working machine.

BRIEF DESCRIPTION OF DRAWINGS

FIG. 6 is a diagram illustrating the data configuration of JOB data.

DESCRIPTION OF EMBODIMENTS

Figure 1:
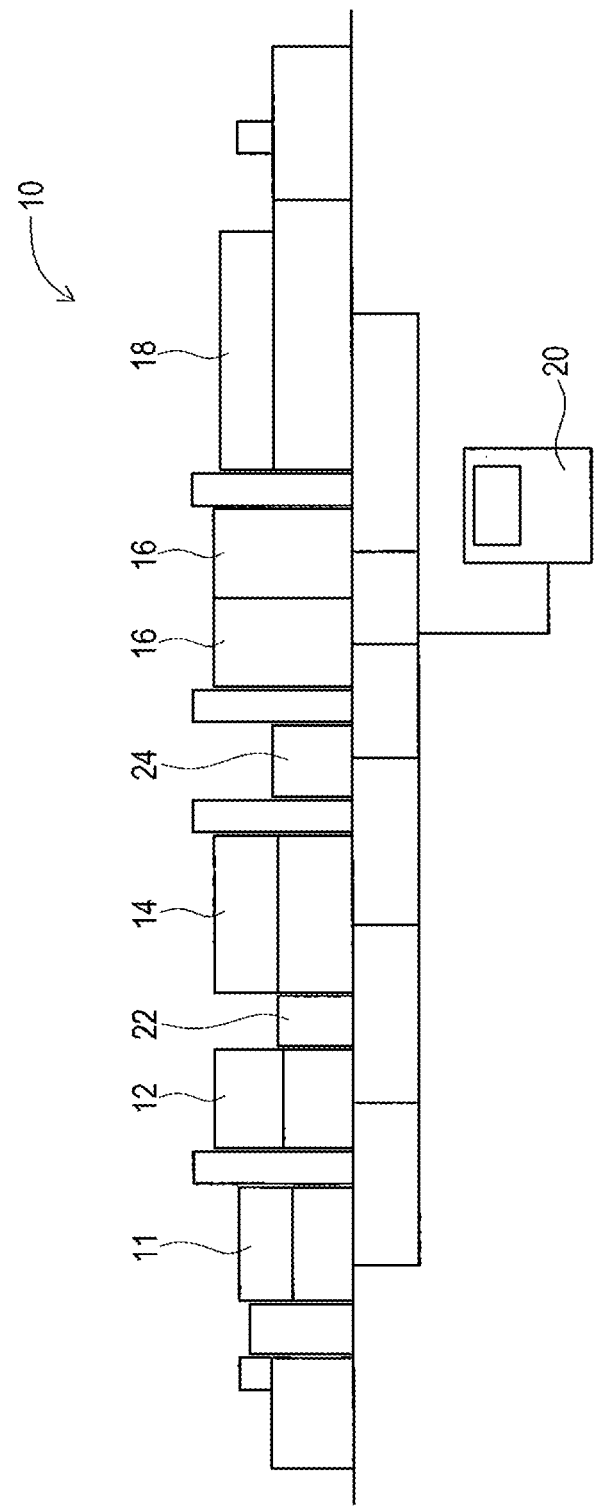
FIG. 1 is an external appearance diagram of an electronic component mounting system of an embodiment.

Hereinafter, an embodiment of the disclosure will be described with reference to the drawings. FIG. 1 schematically illustrates an electronic component mounting system 10 which is an embodiment of the present disclosure. The electronic component mounting system 10 is provided with a screen printer 11, an adhesive application machine 12, electronic component mounting machines (hereinafter shortened to "component mounting machines") 14 and 16, and a reflow furnace 18 which are arranged lined up in a row, and a system control device 20 which unifies and controls these elements. The screen printer 11 moves a squeegee along a mask using a squeegee moving device and prints solder paste onto a circuit board 13 (refer to FIG. 2) such as a printed wiring board which is conveyed in the production line via through-holes in the mask, for example. The adhesive application machine 12 is a high viscosity fluid application machine which applies, as a temporary adhesive, a high viscosity fluid to a plurality of locations on the circuit board 13 which is conveyed in the production line, for example. The component mounting machines 14 and 16 mount components onto a plurality of locations on the circuit board 13 at which the temporary adhesive is applied, and the component mounting operation in relation to the one circuit board 13 is performed by work division, for example, the component mounting machine 14 mounts comparatively small electronic components, and the component mounting machine 16 mounts comparatively large or abnormally shaped electronic components. The reflow furnace 18 melts solder and electrically connects the electronic components onto the circuit board 13. The main constituent of the system control device 20 is a host computer (in the description of the present embodiment, a computer includes not only a data processing device, but also an external input device and a display) which carries out intensive management of the production line which is formed of the plurality of circuit board working machines from the screen printer 11 to the reflow furnace 18. Board handling devices 22 and 24 which subject the circuit board 13 to conveying, waiting, vertical inversion, and the like are provided between the adhesive application machine 12 and the component mounting machine 14, and between the component mounting machines 14 and 16, respectively. For example, the board handling devices 22 and 24 may include a pair of belt conveyors which extend in the conveyance direction and a drive motor which is the drive source, and supply the circuit board 13 each time it is possible to receive the circuit board 13 in the downstream side circuit board working machine.

Figure 2:
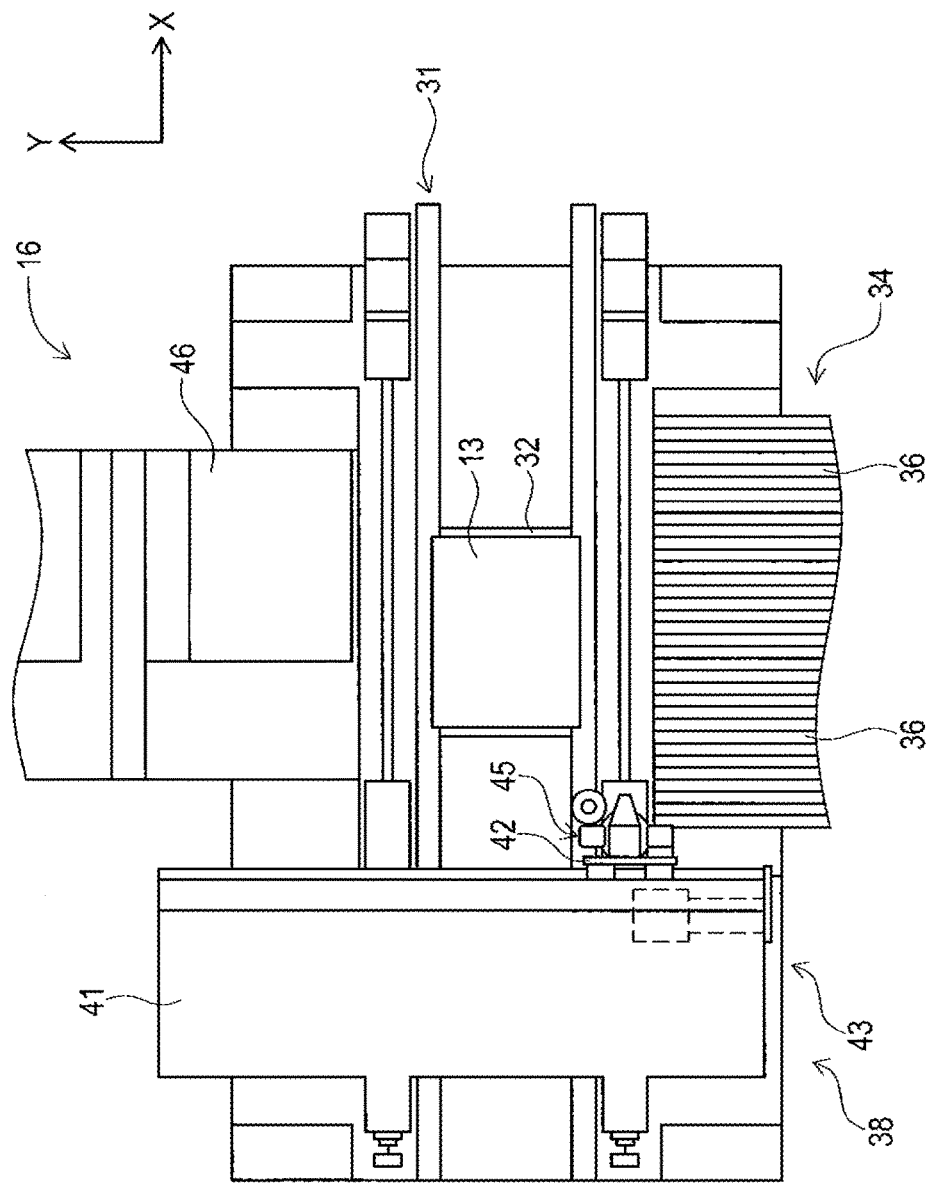
FIG. 2 is a schematic plan view of an electronic component mounting machine constituting a production line of the electronic component mounting system illustrated in FIG. 1.

Each of the circuit board working machines described above is provided with a control computer. Since the configurations of the control computers are substantially the same, description will be given representatively of the component mounting machine 16. A plurality (two in the example illustrated in FIG. 1) of the component mounting machines 16 are provided lined up in the conveyance direction of the circuit board 13 of the production line. As illustrated in FIG. 2, the component mounting machine 16 is an XY robot type mounting machine in which a mounting head 45 is moved to an arbitrary position on an XY coordinate plane. The component mounting machine 16 is provided with a board conveyor 31, and a board holding device 32 is provided on a portion of the board conveyor 31. A component supply device 34 is installed along the board conveyor 31 in the component mounting machine 16. A plurality of component feeders 36 are mounted lined up in the component supply device 34. Each of the plurality of component feeders 36 stores multiple components, and sequentially positions the components at a component supply section which is determined in advance. A mounting device 38 performs mounting operation of receiving the component from the component supply section and mounting the component onto the circuit board 13 which is held in the board holding device 32. The mounting device 38 is provided with a head moving device 43, which is configured by an XY robot provided with an X-axis slide 41 and a Y-axis slide 42, and the mounting head 45 which is moved by the head moving device 43. The mounting head 45 holds a suction nozzle in a detachable manner using a nozzle holding section (omitted from the drawings). The mounting head 45 receives the component from the component feeder 36 using the suction nozzle at a component reception position, and mounts the component onto a predetermined position of the circuit board 13 which is held by the board holding device 32 at a component mounting position. The suction nozzle rotates the held component by being rotated by a nozzle rotating device, as necessary. The component supply device 46 is a tray-type component supply device, stores multiple components in a component tray, and supplies the components onto the mounting head 45.

Figure 3:
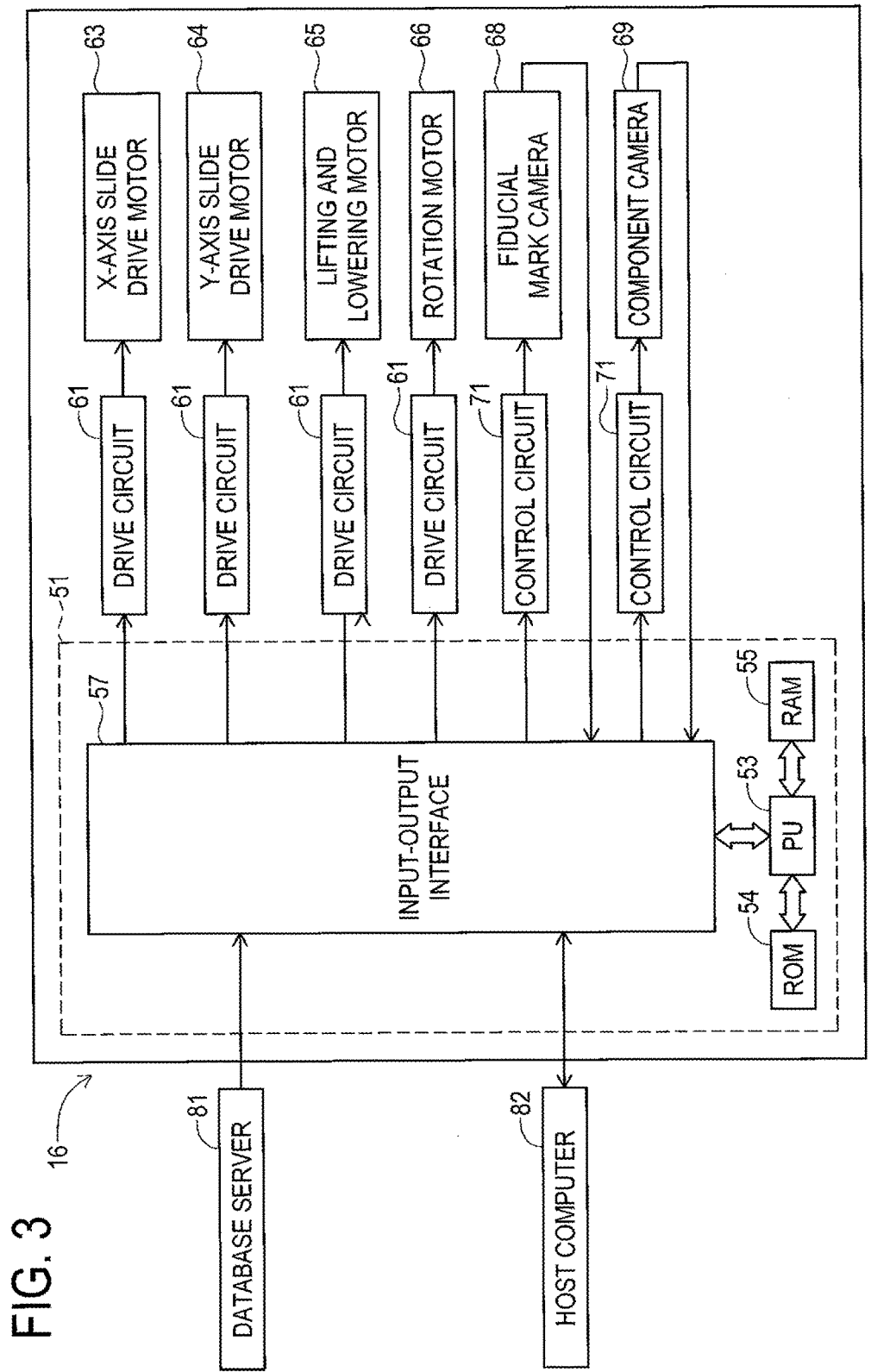
FIG. 3 is a block diagram illustrating the configuration of the electronic component mounting machine.

FIG. 3 is a block diagram illustrating the configuration of the component mounting machine 16. A control computer 51 is provided with a processing unit (PU) 53, a read only memory (ROM) 54, a random access memory (RAM) 55, an input-output interface 57, and a bus which connects these elements. An X-axis slide drive motor 63, a Y-axis slide drive motor 64, a lifting and lowering motor 65, and a rotation motor 66 are connected to the input-output interface 57 via drive circuits 61. The X-axis slide drive motor 63 and the Y-axis slide drive motor 64 are motors which drive the X-axis slide 41 and the Y-axis slide 42 illustrated in FIG. 2. The lifting and lowering motor 65 and the rotation motor 66 are a motor which drives the nozzle lifting and lowering device to lift and lower the suction nozzle and a motor which drives the nozzle rotating device to rotate the suction nozzle. Two cameras, a fiducial mark camera 68 which images fiducial marks on the circuit board 13, and a component camera 69 which images the component that is held by the suction nozzle of the mounting head 45 are connected to the input-output interface 57 via control circuits 71. The control computer 51 controls each of the motors 63 to 66 and each of the cameras 68 and 69 in cooperation with the drive circuits 61 and the control circuits 71. The control computer 51 is connected to a database server 81, a host computer 82, and the like via the input-output interface 57.

Figure 4:
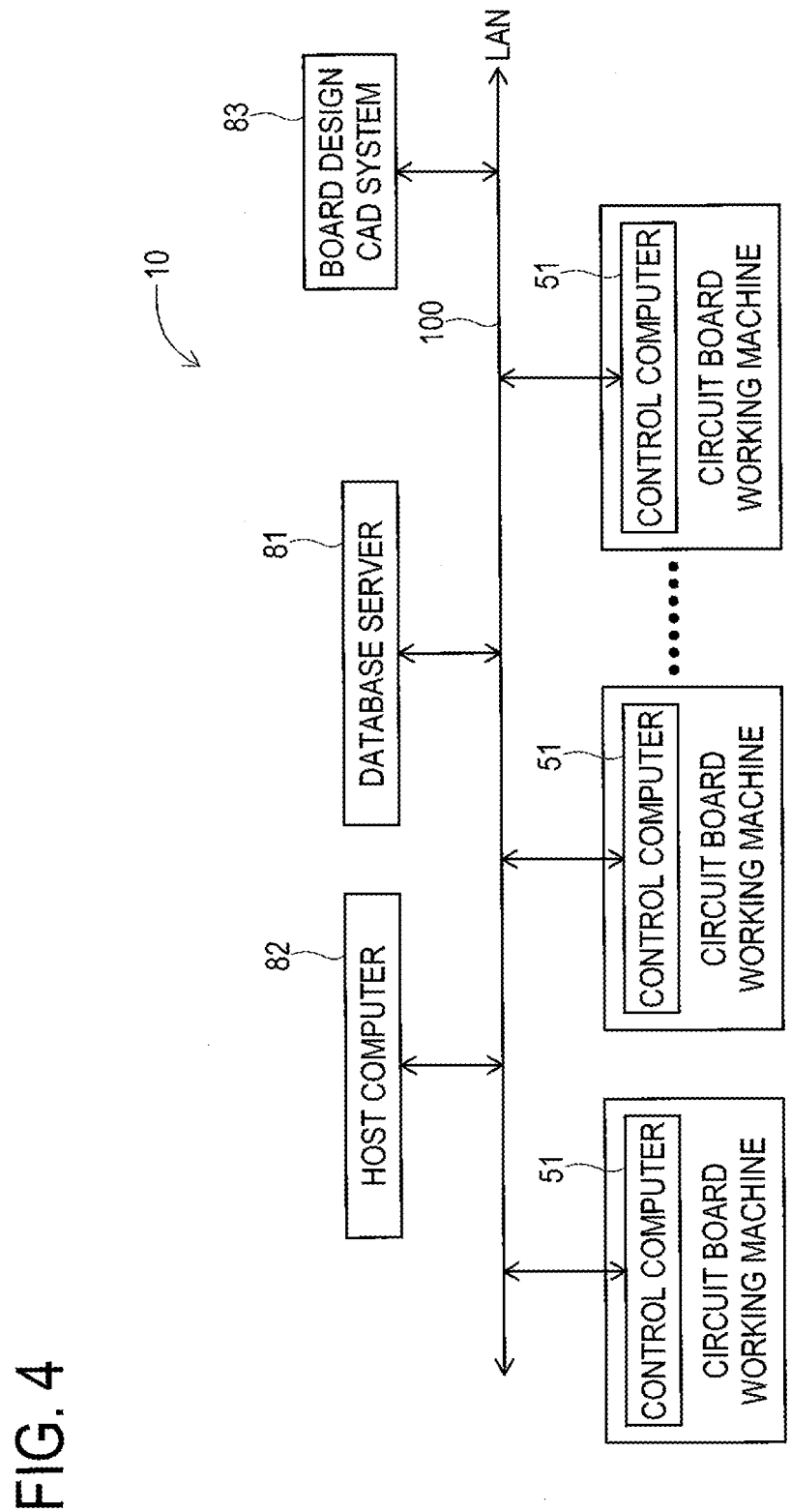
FIG. 4 is a configuration diagram of a network of the electronic component mounting system.

FIG. 4 illustrates the network configuration of the electronic component mounting system 10. The control computer 51 of the plurality of circuit board working machines (the component mounting machines 16 and the like) described above is connected to the database server (hereinafter referred to as a "DB server") 81, the host computer 82, and a board design Computer-Aided Design (CAD) system 83 using a local network (hereinafter referred to as a "LAN") 100. The DB server 81, the host computer 82, and the CAD system 83 form the system control device 20 described above. The host computer 82 creates a recipe which is setting data instructing work content to be performed by each of the plurality of circuit board working machines, specifically, setting data for the control computer 51 which is necessary in the control of each of the circuit board working machines, and transfers the setting data to each of the circuit board working machines. For example, the host computer 82 creates a recipe instructing work content such as "which electronic component is to be mounted at which mounting coordinates of the printed circuit board which is conveyed" in relation to each of the component mounting machines 14 and 16 before board production based on the data (refer to FIGS. 5 and 6) which is stored in the DB server 81. When generating sequence data 110 (refer to FIG. 6) which is described later, the host computer 82 refers to the CAD data which is stored in the CAD system 83. Note that, the DB server 81 and the CAD system 83 are shared by a plurality of the electronic component mounting systems 10 (production lines), and a configuration may be adopted in which the host computer 82 of another production line accesses the DB server 81 and the CAD system 83 via the LAN 100. The network via the LAN 100 illustrated in FIG. 4 may be configured such that a device other than the depicted devices is capable of connecting, for example, and may be a configured such that a portable terminal on which software capable of changing the data which is stored in the DB server 81 is installed is capable of connecting using wireless communication.

Figure 5:
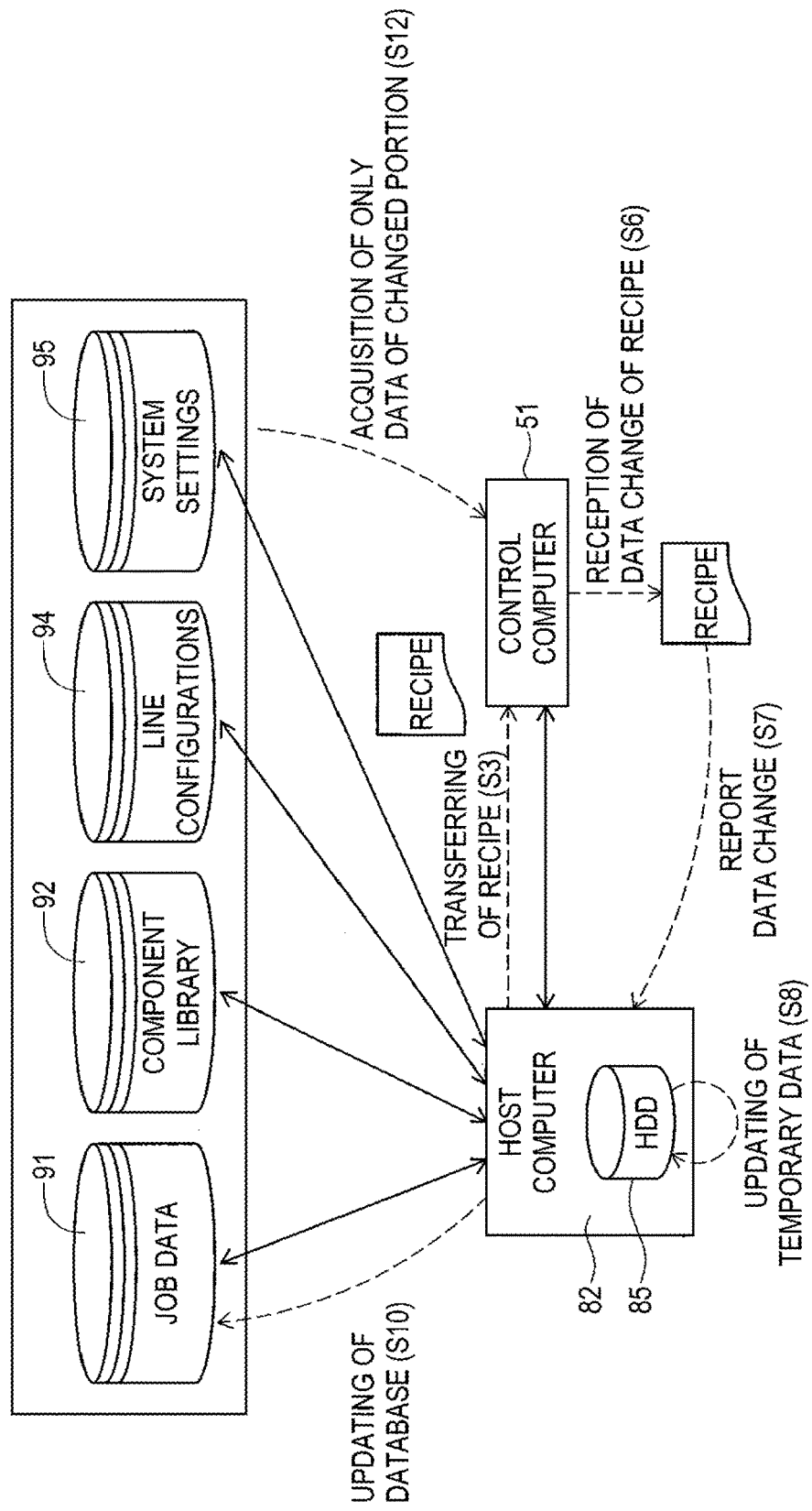
FIG. 5 is a schematic diagram for illustrating data transfer between a database server, a host computer, and a control computer.

FIG. 5 schematically illustrates data transfer between the database server 81, the host computer 82, and the control computer 51. As illustrated in FIG. 5, in the present embodiment, four databases, JOB data 91, a component library 92, line configurations 94, and system settings 95, are broadly classified and constructed in the DB server 81. The JOB data 91 stores information of the circuit board 13 (refer to FIG. 2), information indicating which components are to be mounted onto which positions on the circuit board 13, and the like. FIG. 6 illustrates a portion of the JOB data 91, for example, the data groups of the configuration illustrated in FIG. 6 are set in the JOB data 91, and a recipe including a portion or the entirety of the data groups is created. For example, sequence data 110, BOM data 112, part data 113, and board type correlation data 114 are set in the JOB data 91. The sequence data 110 is data relating to the coordinate positions at which to mount the electronic components onto the circuit board 13. Mounting coordinates of the electronic components (X-axis coordinate (X1, X2, X3, . . . ), Y-axis coordinate (Y1, Y2, Y3, . . . ), a rotational angle (for example, an angle ($\theta$1, $\theta$2, $\theta$3, . . . ) in a rotation direction in a plane which is level with the XY coordinate plane), and a circuit symbol (Ref1, Ref2, Ref3, . . . )) are set in the sequence data 110. Plural items of data indicating the mounting coordinates and the circuit symbols are, for example, related to one record in which each item of data such as X1-Y1-$\theta$1-Ref1 is a field.

The BOM data 112 is data relating to a BOM (Bills of Materials: component table) which is set for each type of printed circuit board. Data relating to a plurality of BOMs (BOM1, BOM2, . . . ) is set in the BOM data 112. For example, in BOM1, the circuit symbols (Ref1, Ref2, Ref3, . . . ) are related to the component types (a, b, c, . . . ) of the electronic components. The circuit symbols and the component types are related as, for example, Ref1-a. In the other BOMs from BOM2 onward, the circuit symbols are related to the component types in the same manner as in BOM1.

Data relating to the shapes and supply modes of the electronic components, for example, is set in the part data 113. The component type of the electronic components (a, b, c, d, . . . ), the shape of each electronic component (X-axis length (x1, x2, x3, x4, . . . ), Y-axis length (y1, y2, y3, y4, . . . ), and lead type (r1, r2, r3, r4, . . . )), and supply mode data of each electronic component (for example, if a tape feeder is used, data indicating how many millimeters the tape is, at how many millimeters interval the storage positions of the components are provided, and the like for the component tape) are set in the part data 113. Plural items of data indicating the shape and supply mode of the electronic component are, for example, related in a manner such as a-x1-y1-r1-(data indicating 8 mm tape, 4 mm feed). The part data 113 is data which is used in common by a plurality of board types. Data in which the board type (Key1, Key2, Key3, . . . ) is related to the BOM (BOM1, BOM2, BOM3, . . . ) is set in the board type correlation data 114.

Various information relating to the components which is necessary for creating the JOB data 91 including the part data 113 which is described above is stored in the component library 92 illustrated in FIG. 5. In other words, data relating to the components such as the part data 113 is stored in the databases of both the JOB data 91 and the component library 92 in the DB server 81 of the present embodiment. The DB server 81 is set such that, in a case in which there is a change to one of the databases of the two databases (the JOB data 91 and the component library 92), for example, the change is not reflected in the other database until the host computer 82 approves the changed content under the instruction of a supervisor of the production line or the like. Note that, settings may be adopted in which, in a case in which there is a change in the data in one of the two databases (the JOB data 91 and the component library 92), the data is automatically synchronized with the other database.

The line configurations 94 illustrated in FIG. 5 is information relating to the configurations of all of the production lines which are managed by the host computer 82, and, for example, includes information indicating the order of the plurality of circuit board working machines which are lined up in a row to be connected in each production line. Data relating to management information of the database itself such as the storage position of each item of data, and data relating to the configuration of each circuit board working machine (for example, the types of suction nozzle which may be mounted, and the like) is stored in the system settings 95. The host computer 82 accesses the DB server 81 in which the four databases described above are stored and executes processes such as acquisition and updating of data. Note that, the configuration of the data which is stored in the DB server 81 illustrated in FIG. 5 is an example, and is changed, as appropriate, by carrying out importing of a database, addition of records, and the like as necessary according to changes in the production line or the like.

Next, description will be given of the process procedure of the electronic component mounting system 10 of the present embodiment during the changing of data of the DB server 81 described above, with reference to FIGS. 7 and 8. First, in step S1 (hereinafter shortened to S1, and the same also applies to the other steps) illustrated in FIG. 7, the sequence data 110 (refer to FIG. 6) is created by the host computer 82. CAD data relating to the component type of the electronic components and the mounting coordinates is stored in the CAD system 83. For example, a worker or the like creates the sequence data 110 relating to the board type (for example, Key1) of the printed circuit board which is the production target by operating the host computer 82. The host computer 82 refers to the CAD data of the CAD system 83 corresponding to an operation of the worker or the like and generates the sequence data 110. Note that, the electronic component mounting system 10 may be configured such that the production target board type is input automatically. For example, the electronic component mounting system 10 may be configured to read the identification code which is displayed on the printed circuit board using the fiducial mark camera 68 which is provided on the component mounting machine 14, and the production target board type may be automatically input to the host computer 82 based on the read identification code.

Next, a recipe is created by the host computer 82 (S2). The host computer 82 refers to the board type correlation data 114 of the JOB data 91 and selects the BOM (for example BOM1) corresponding to the board type Key1. For example, the host computer 82 refers to the circuit symbol (Ref1, . . . ) of each item of data of the sequence data 110 and the BOM data 112 (BOM1) and relates the two items of data. Accordingly, which component type (a, b, c, . . . ) is mounted at which mounting coordinates (the X-axis coordinate, the Y-axis coordinate, and the rotational coordinate) of the production target printed circuit board. For example, the host computer 82 refers to the component type (a, b, c, . . . ) of each item of data of the BOM data 112 (BOM1) and the part data 113 and relates the two items of data. Accordingly, data indicating which electronic component is mounted at which mounting coordinates of the production target printed circuit board is created. The host computer 82 sets the other necessary data (the number of the circuit boards 13 (refer to FIG. 2) to be produced or the like) in the data and creates a recipe.

For example, this recipe is transferred to the necessary control computer 51 via the LAN 100 after the host computer 82 determines which electronic components to mount onto the circuit board 13 using which of the component mounting machines 14 and 16 (S3, refer to FIG. 5). The transferring of the recipe may be carried out automatically by the host computer 82 from the DB server 81 toward each of the control computers 51; however, the transferring of the recipe may also be carried according to operation of the host computer 82 or the control computer 51. Each of the circuit board working machines of the electronic component mounting system 10 executes staged mounting operation according to the allocated recipe.

Each of the control computers 51 controls each of the circuit board working machines based on the transferred recipe; however, whether or not there is some kind of problem in the recipe is monitored by a worker (a worker in charge, a supervisor, an inspector of the produced electronic circuit, or the like) of the circuit board working machine. In a case in which there is a problem and it is necessary to change some item of the data in the recipe, it is determined whether to perform the changing of the data in the host computer 82 or whether to perform the changing of the data in the control computer 51 (S4), and in a case in which the prior is determined, the changing of the data is received by the host computer 82 (S5), and in a case in which the latter is determined, the changing of the data is received by the control computer 51 (S6). For example, in a case in which the mounting position of the electronic component on the circuit board 13 which is produced is shifted, the worker in charge of the circuit board working machine performs an input process or the like which changes the problematic data by operating the circuit board working machine (the control computer 51). More specifically, for example, the component mounting machine 16 detects the error of the holding position based on the image data in which the electronic component in a state of being held by the suction nozzle of the mounting head 45 is captured by the component camera 69. There is a case in which an error arises in the processing results in relation to the image data due to the device-specific characteristics (differences in the brightness and the like) such as the lighting with which the mounting head 45 is provided. Therefore, in a case in which issues such as there being an error in the data of the shapes of the electronic components which are detected from the results of the image processing and the shapes of the components which are set in advance (refer to the part data 113 of FIG. 6) and the suction positions and the mounting positions are shifted, the worker amends the data relating to the shapes of the components in the recipe. Similarly, even in a case in which an error or the like arises in the other data, for example, the data (the sequence data 110 of FIG. 6) relating to the mounting positions of the electronic components, the worker amends the data relating to the mounting positions contained in the recipe. In a case in which there is an operation of changing the recipe by the worker, it is necessary to change the data relating to the work target circuit board 13 in the data (the JOB data 91 or the like) which is stored in the DB server 81.

The control computer 51 which receives the changes of the data in S6 reports the changed content of the recipe data to the host computer 82 without reflecting the changes in the recipe being executed (S7, refer to FIG. 5). For example, this is because it is necessary to link the recipes provided in both the control computer 51 side and the host computer 82 side after confirming, verifying, and the like the changed content using the host computer 82. In a case in which the control computer 51 receives data changes, for example, a person performing input operates an external input device while viewing the display of a display and inputs the necessary data (there is no problem even if plural items of data are included), and if input determining that the data will be changed is performed at the time at which the input is completed, a process in which the changed content is reported to the host computer 82 is performed.

The host computer 82 temporarily accumulates the recipe of each of the control computers 51 as work data in a memory device 85 (refer to FIG. 5) such as a hard disk.

Before updating the data of the DB server 81, the host computer 82 updates the work data which is stored in the memory device 85 based on the recipe changes for which reports are received (S8, refer to FIG. 5). The host computer 82 holds the content of the recipe changes for which reports are received in the memory device 85 until the worker performs an approving process using an external input device or the like (S9: NO). Note that, the destination in which to temporarily save the recipes as work data is not limited to the memory device 85 with which the host computer 82 is provided, and may be another device capable of storage (the DB server 81 or the like).

Meanwhile, when the host computer 82 receives recipe changes based on input data obtained by a worker operating an external input device, for example, (S5), the host computer 82 changes the recipe data of the memory device 85 and does not update the data of the DB server 81 until the final acceptance is performed by the worker (S9: NO). The host computer 82 updates the data of the DB server 81 based on the change in the data of the memory device 85 according to the acceptance (S9: YES) by the worker (S10). Note that, depending on the determination of the worker, in a case in which there is a mistake in the content of the data for which a report is received from the control computer 51, amendment of the changed content and notification of an error to the control computer 51 are performed by the host computer 82. It is preferable that the host computer 82 is provided with a device (a card reader for reading an identification card or the like) for identifying the worker performing the operation, and that the host computer 82 is configured to determine whether or not the worker which accepts the data changes has operating authorization.

Here, in the electronic component mounting system 10 of the present embodiment, the host computer 82 executes control in which, of the data which is stored in the DB server 81, only the changed portion is transferred to the control computer 51. The host computer 82 transmits an instruction indicating that only the partial data relating to the updates among the data which is stored in the DB server 81 is to be acquired to the control computer 51 which receives the recipe changes (S11). In a case in which the host computer 82 receives the recipe changes in S5, the host computer 82 transmits an instruction indicating that data is to be acquired to the control computer 51 which includes the data of the DB server 81 which is updated in S10, that is, which uses the data relating to the changes in the control (S11). The control computer 51 executes a process in which only the partial data relating to the updates is transferred from the DB server 81 according to the instruction from the host computer 82 (S12, refer to FIG. 5). Note that, in a case in which the host computer 82 updates the changed content for which reports are received as it is in the DB server 81, that is, in a case in which the control computer 51 updates the DB server 81 with the content which is received by the control computer 51 as it is, the host computer 82 may be set to transmit instructions permitting the reflection of the recipe with the changed content which is received by the control computer 51 as it is to the control computer 51 as a "updated data acquisition instruction." In this case, for example, the control computer 51 may be set to temporarily store the changed content which is received in the memory or the like until there is an instruction from the host computer 82, and to perform a process in which the content which is stored in the memory is reflected in the recipe when an instruction is received.

Next, the control computer 51 executes a process in which the partial data relating to the updates which are transferred from the DB server 81 is reflected in the recipe with which the control computer 51 is provided (S13). At this time, the control computer 51 executes the changes of only the data which is necessary among the data contained in the recipe, for example. The control computer 51 determines whether or not the control computer 51 is in a state in which it is possible to change the recipe of the control computer 51. For example, in a case in which the control computer 51 of the component mounting machine 14 or 16 is executing the mounting operation of a component onto the circuit board 13 based on the created recipe, it is not desirable for the data of the mounting position of the component to be changed. Therefore, the changing of the data of the component being worked on is prohibited for most of the data of the recipe. Meanwhile, the data of the number of the circuit boards 13 to be subjected to the mounting operation may be changed without problems except for at a special time at which the data is compared to the number of the circuit boards 13 on which the mounting has already been performed. In this manner, since the times at which it is possible to change each item of data are different, in S13, the control computer 51 reflects the changes of the data in the recipe while performing a determination of whether or not there are presently items of data which are possible to change among the items of data to be changed. Note that, a configuration may be adopted in which, for the transferring of the data relating to the update, the process is started using a query from the control computer 51 toward the host computer 82 as a starting point.

The present embodiment described in detail above has the following effects.

<Effect 1> In the electronic component mounting system 10 of the present embodiment, the host computer 82 creates the recipe (the setting data) which is used in the control by each of the control computers 51 of the plurality of circuit board working machines such as the screen printer 11, the adhesive application machine 12, the component mounting machines 14 and 16, and the reflow furnace 18 based on the data of the DB server 81. When a change in the data contained in the created recipe are received by one of the plurality of circuit board working machines, the circuit board working machine which received the changes reports the changed content of the recipe to the host computer 82 (step S7 of FIG. 7). The host computer 82 which receives the report updates the data which is stored in the DB server 81 based on the changed content of the recipe (S10). The control computer 51 which receives the changes of the recipe executes a process in which, of the data which is stored in the DB server 81, only the partial data which is updated by the host computer 82 is acquired (S12).

Here, in the related art, for example, the host computer 82 executes a process in which a recipe which is newly created based on the updated data of the DB server 81 is transferred to the necessary control computers 51. At this time, when the control computer 51 receives an instruction from the host computer 82, all of the newly created recipe data is received and used to replace the recipe data being executed, and thus, the changed content is reflected in the created recipe. Therefore, the control computer 51 must perform a process in which the entirety of the recipe is received anew every time there is an operation in which the data of the created recipe is changed, and there is a concern that the data transfer time between the control computer 51 and the DB server 81 will become longer and that delays or the like will arise in the post-change work. To handle this, in the electronic component mounting system 10 of the present embodiment, the host computer 82 executes control in which, of the data which is stored in the DB server 81, only the changed portion is transferred to the control computer 51. Accordingly, it is possible to achieve a reduction in the data amount to be transferred when the electronic component mounting system 10 transfers data relating to a change in a recipe between the DB server 81 and each of the control computers 51 (the circuit board working machines). The processing time until the control computer 51 receives the data, in which the data amount is reduced, to be received from the DB server 81 is shortened. In the electronic component mounting system 10, since the transferred data amount is limited to only the necessary portion, the error occurrence rate in the data transfer is reduced and error detection, correction, processing in a case in which an error occurs becomes easy. As a result, it is possible to configure the electronic component mounting system 10 in which a shortening in the transfer time can be obtained while reliably transferring the changed content of the recipe data between the DB server 81 and each of the circuit board working machines.

<Effect 2> When the data of the DB server 81 is updated (S10), the host computer 82 transmits an instruction indicating that the data which is stored in the DB server 81 is to be acquired to the control computer 51 which receives the recipe changes (S11). The control computer 51 executes a process in which only the partial data relating to the updates is transferred from the DB server 81 according to the instruction from the host computer 82 (S12). Accordingly, it becomes possible for the host computer 82 to instruct the process of data acquisition from the DB server 81 by the control computer 51 after the updating process of the DB server 81 is completed. Therefore, the host computer 82 instructs the process of data acquisition from the DB server 81 by the control computer 51 after updating the data of the DB server 81 based on the data which is temporarily accumulated in the memory device 85 which is changed based on the recipe changes which are reported by the control computer 51. Therefore, the control computer 51 is capable of reliably acquiring the data of the DB server 81 which is changed.

<Effect 3> The host computer 82 temporarily accumulates the recipe of each of the control computers 51 as work data in the memory device 85 (refer to FIG. 5). Before updating the data of the DB server 81, the host computer 82 updates the work data which is stored in the memory device 85 based on the recipe changes for which reports are received (S8). The host computer 82 waits until the worker performs an approval process for the changed content of the recipe for which a report is received, and updates the data of the DB server 81 based on the change in the data of the memory device 85 according to the approval (S10). Accordingly, since the electronic component mounting system 10 waits for a worker to confirm and approve the changed content for which a report is received from the circuit board working machine before executing the updating of the DB server 81, the validity of the data and the reliability of the updating work of the DB server 81 are improved. In the electronic component mounting system 10, since the recipe of the control computer 51 is not changed until the approval is carried out using the host computer 82, it is possible to manage the timing at which the change in the recipe of the control computer 51 are finally reflected using the host computer 82.

<Effect 4> In the control computer 51, of the data contained in the recipe, the data (the part data 113) relating to the shapes of the electronic components to be mounted onto the circuit board 13 by the circuit board working machine and the data (the sequence data 110) relating to the mounting positions are changed according to the mounting results, and the control computer 51 receives the changes and process a report to the host computer 82. In the electronic component mounting system 10, in a case in which the mounting positions of the electronic components on the circuit board 13 which is produced, for example, since the worker performs a process in which the problematic data is changed by operating the circuit board working machine, the desired changed corresponding to the mounting results are swiftly reflected in the system.

<Effect 5> The control computers 51 of the plurality of circuit board working machines are connected to the DB server 81, which is provided to be shared therebetween, via the LAN 100. In this configuration, for example, even if it becomes necessary to use the electronic components with different component mounting machines 14 and 16 from the component mounting machines 14 and 16 (the circuit board working machines) which were being used, it becomes possible to reflect the changed which were performed by the previous component mounting machines 14 and 16 on the next component mounting machines 14 and 16. When electronic components with the same component shape and supply mode are used in the plurality of component mounting machines 14 and 16, for example, if the shape data (the part data 113) of the components of the recipe is changed in one of the component mounting machines 14 and 16 or if the component library 92 is changed together with this change, it becomes possible for the other component mounting machine 14 or 16 to change the shape data of the components of the created recipe according to the change in the data of the DB server 81.

<Effect 6> When the host computer 82 receives changes to the recipe based on an operation of an external input device by a worker (S5), host computer 82 updates the data of the DB server 81 through the acceptance of the worker (S10). The host computer 82 transmits an instruction indicating that data is to be acquired to the control computer 51 which uses the updated data of the DB server 81 in the control (S11). Accordingly, even if there is a change in the recipe on the host computer 82 side, it is possible to swiftly reflect the changed content in the recipe on the circuit board working machine (the control computer 51) side. Note that, even in a case in which the host computer 82 receives not only the change in the recipe, but also the change in each of the databases such as the component library 92, by executing a similar process, the host computer 82 is capable of swiftly reflecting the changed content of the data which is stored in the DB server 81 in the recipe of the circuit board working machine side.

Here, the electronic component mounting system 10 is an example of a circuit board work system. The recipe (the setting data), and each of the databases of the DB server 81 (the JOB data 91, the component library 92, the line configurations 94, and the system settings 95) is an example of the data relating to the work target circuit board. A portion of the control computer 51 of the circuit board working machine which receives the change in the recipe which reports the changed content to the host computer 82 is an example of a change reporting section. A portion which updates the data which is stored in the DB server 81 based on the changed content of the host computer 82 which receives the report of the recipe changes is an example of a database updating section. A portion of the control computer 51 which receives the recipe changes which acquires only the partial data which is updated by the host computer 82 among the data which is stored in the DB server 81 is an example of a data acquisition section.

Note that, the present disclosure is not limited to the embodiment described above, and it goes without saying that various improvements and modifications are possible within a scope that does not depart from the gist of the present disclosure. For example, in the embodiment described above, the host computer 82 is capable of accessing the DB server 81; however, the control computer 51 of each of the circuit board working machines may also be configured to be capable of directly accessing the DB server 81 without going through the host computer 82. A configuration may also be adopted in which the DB server 81 periodically confirms whether or not there are recipe changes from the control computer 51 to the host computer 82, and regardless of the control of the host computer 82, the DB server 81 refers to the changed content which is reported to the host computer 82 and updates the database itself.

In the embodiment described above, the control computer 51 reports the changed content of the recipe which is received to the host computer 82; however, another device (the DB server 81 or a portable terminal) which is connected to the LAN 100 may confirm the changed content of the recipe which is received by the control computer 51 and report the changed content to the host computer 82, or the host computer 82 may periodically confirm the changed content of the control computer 51.

The device which temporarily saves the recipes as work data is not limited to the memory device 85 with which the host computer 82 is provided, and may be another device capable of storage (the DB server 81 or the like). In this case, the DB server 81 may execute a process in which the work data is accumulated, the work data is updated based on the changed content, and the change in the work data are reflected in the database according to the approval of the host computer 82 (the worker).

Figure 7:
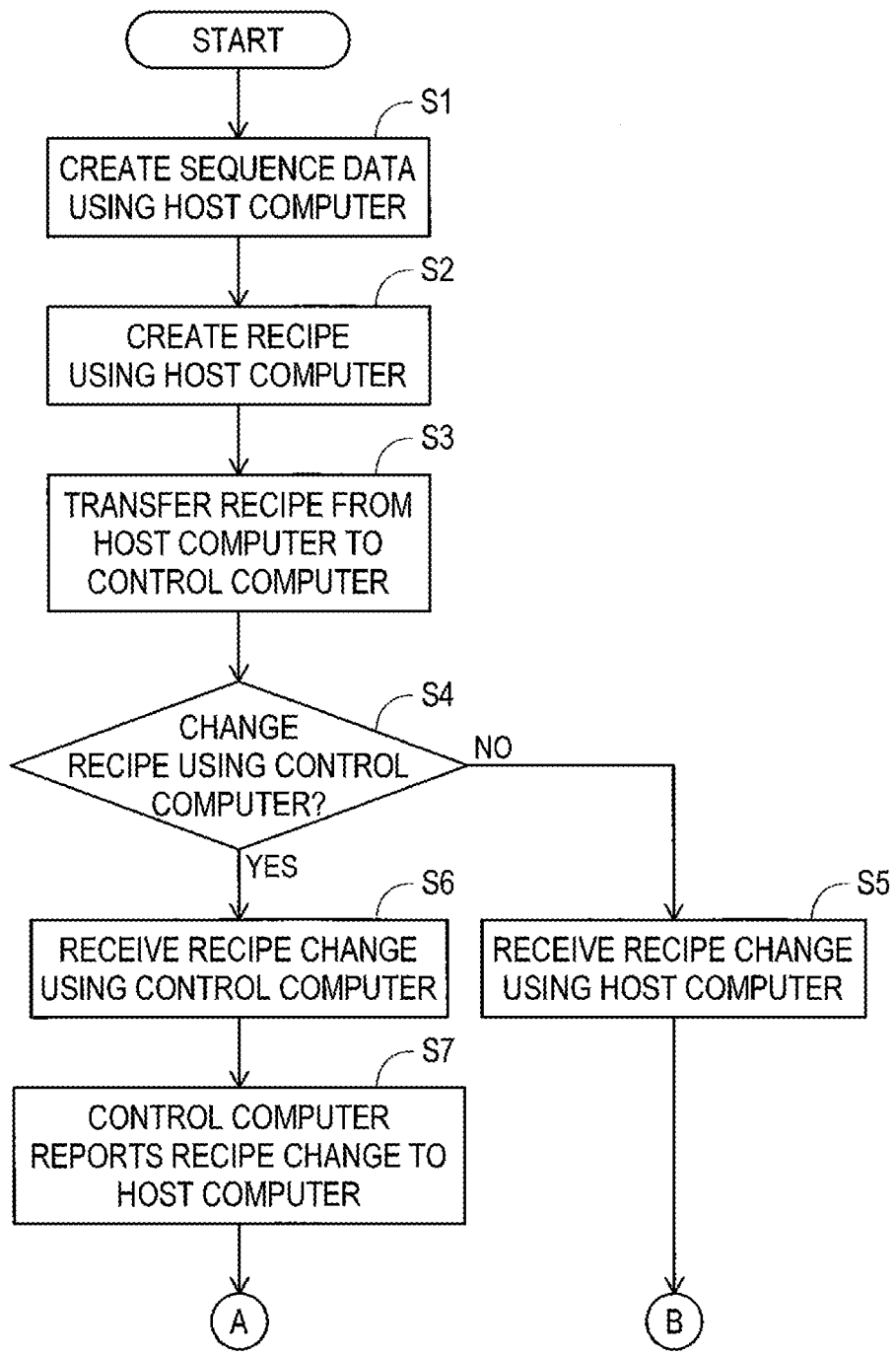
FIG. 7 is a flowchart for illustrating a process procedure of the electronic component mounting system based on a change in the data contained in a recipe.
Figure 8:
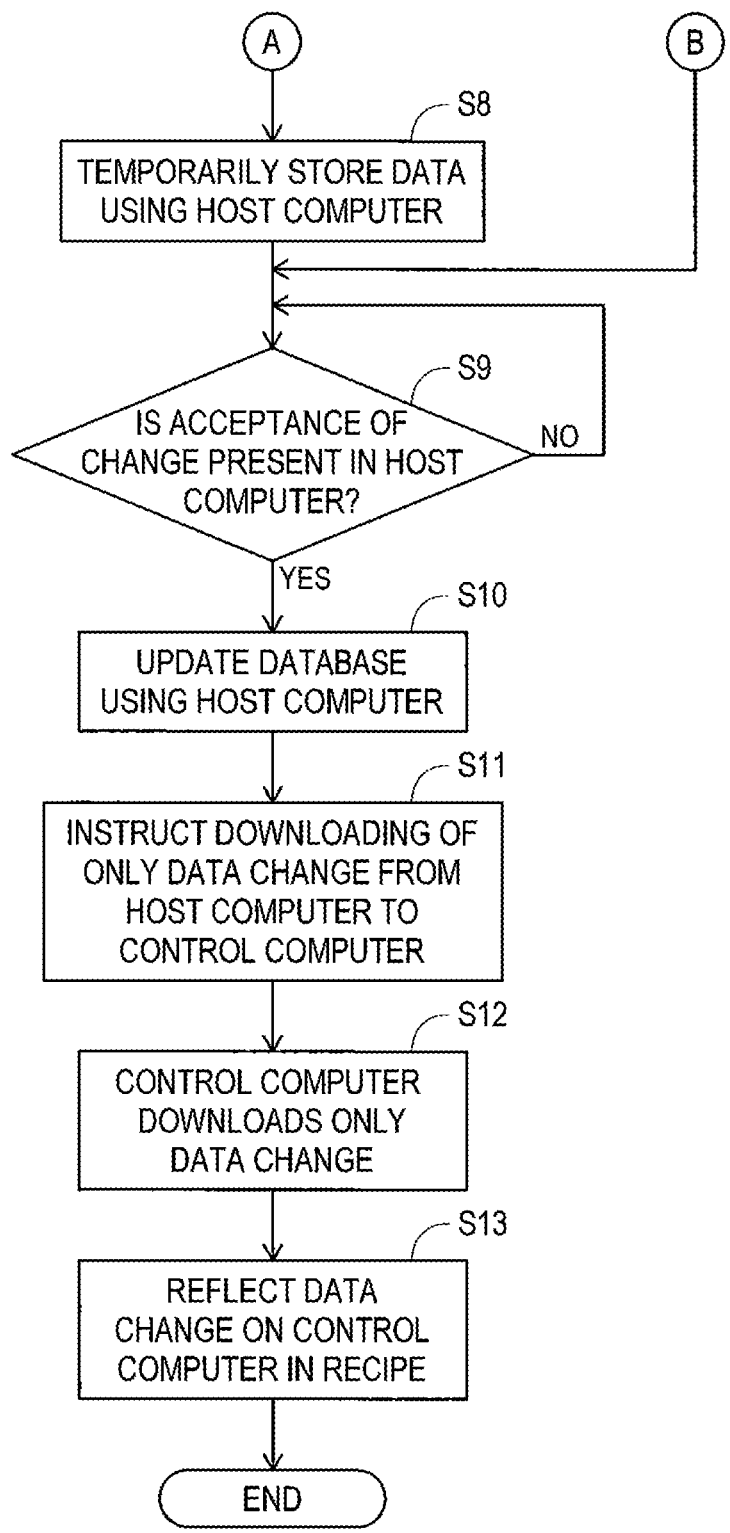
FIG. 8 is a flowchart for illustrating a process procedure of the electronic component mounting system based on a change in the data contained in a recipe.

The process content illustrated in FIGS. 7 and 8 are examples and may be changed as appropriate. For example, the host computer 82 is configured to execute a process in which, before updating the data of the DB server 81, the host computer 82 updates the work data which is saved in the memory device 85 and waits until the approval of the worker; however, a configuration may be adopted in which the host computer automatically verifies the validity and the like of the data of the changed content for which a report is received and reflects the data of the changed content in the DB server 81 after approval is performed. In this case, it is possible to omit the memory device 85 which stores the work data and the process of S8 illustrated in FIG. 8. The control computer 51 may be configured to include a function of creating a recipe (setting data) based on the data which is stored in the DB server 81. The electronic component mounting system 10 may be configured such that the updating of the recipe may not be carried out using the host computer 82, but may be carried out only by the control computer 51. In this case, it is possible to omit the processes of S4 and S5 of FIG. 7.

Description is given of the electronic component mounting system 10 which mounts electronic components onto the circuit board 13 in the above embodiment; however, the present application is not limited thereto, and may be applied to which shares data which is common to the database server in other various production lines. For example, the present application may be applied to the data updating of setting data for a control computer which controls each work robot in a production line using work robots which carry out assembly work of secondary cells (solar cells, fuel cells, or the like) or the like.

REFERENCE SIGNS LIST

10: electronic component mounting system, 13: circuit board, 14, 16: component mounting machine, 51: control computer, 81: database server, 82: host computer

The invention claimed is:

1. A data updating method of a circuit board work system, the method comprising:
   creating setting data of an operation of the circuit board work system by a host computer, the host computer being connected to a plurality of control computers, each control computer being connected to a corresponding circuit board working machine, and the setting data including mounting coordinates of a production target and corresponding electronic components;
   storing the setting data in a database server, which is controlled by the host computer;
   transmitting the setting data from the host computer to one of the plurality of the control computers;
   detecting a change or an error of one of the circuit board working machines;
   reporting a change in the setting data relating to the detected change or the detected error of the one of the circuit board working machines to the host computer;
   updating the setting data stored in the database server, by the host computer, based on the change in the setting data; and
   acquiring partial data relating to the update among the setting data stored in the database server by the one of the plurality of the control computers.

2. The data updating method of the circuit board work system according to claim 1, further comprising:
   transmitting an instruction indicating that the partial data relating to the update is to be acquired from the database server to the one of the plurality of the control computers by the host computer; and
   acquiring the partial data relating to the update according to the instruction by the one of the plurality of the control computers.

3. The data updating method of the circuit board work system according to claim 1, wherein before the updating the setting data stored in the database server,
   approving changed content of the setting data based on the detected change or the detected error of the one of the circuit board working machines.

4. The data updating method of the circuit board work system according to claim 1, wherein content in which at least one data item in the setting data stored in the database sever relating to shapes and mounting positions of the electronic components which are mounted onto a circuit board by each of the circuit board working machines is changed according to results of mounting the electronic components onto the circuit board.

5. The data updating method of the circuit board work system according to claim 1, further comprising:
   updating the setting data stored in the database server based on input data of an external input device.

6. A circuit board work system, comprising:
   a plurality of circuit board working machines each of which is provided with a control computer and which performs work on a circuit board;

a host computer which is shared by the plurality of circuit board working machines and which manages each of the plurality of the control computers;
a database server; and
circuitry configured to
- create setting data of an operation of the circuit board work system by the host computer, the setting data including mounting coordinates of a production target and corresponding electronic components;
- storing the setting data in the database server, which is controlled by the host computer;
- transmit the setting data from the host computer to one of the plurality of the control computers;
- detect a change or an error of one of the plurality of the circuit board working machines;
- report a change in the setting data relating to the detected change or the detected error of the one of the plurality of the circuit board working machines to the host computer;
- update the setting data stored in the database server based on the change in the setting data; and
- acquire partial data relating to the update among the setting data stored in the database server by the one of the plurality of the control computers.

* * * * *